United States Patent [19]

Miner

[11] 3,841,164

[45] Oct. 15, 1974

[54] TUNER DRIVE ASSEMBLY WITH NEUTRALIZED BIAS FOR ENHANCED STABILITY

[75] Inventor: Carroll R. Miner, Wilbraham, Mass.

[73] Assignee: General Instrument Corporation, Newark, N.J.

[22] Filed: Apr. 2, 1973

[21] Appl. No.: 347,221

[52] U.S. Cl. .................................. 74/10.54, 74/10.6

[51] Int. Cl. .......................... H03j 1/06, F16h 35/18

[58] Field of Search ........................... 74/10.54, 10.6

[56] References Cited

UNITED STATES PATENTS 3,618,405 11/1971 Ishida ................................ 74/10.54

*Primary Examiner*—Allan D. Herrmann

[57] ABSTRACT

A tuner drive assembly for use with a tuning mechanism in a TV receiver or the like having an actuating member, a coarse tuning shaft and a fine tuning shaft. First and second means are provided for connecting each of said shafts to said actuating member for operating the latter. The first means comprises a pair of relatively movable parts which normally rotate together in accordance with the rotation of the coarse tuning shaft. The second means comprises a cam, and, situated on one of the parts, a cam follower engaging the cam. The cam is drivingly connected to the fine tuning shaft and the movement of the cam causes relative movement between the parts. The cam surface has a relatively steep slope to provide the desired fine tuning sensitivity. Biasing means are operably active on the cam follower to exert a force on the cam surface to maintain an operable connection between the cam and the cam follower. The biasing means are effective to cause the force exerted on the cam to be substantially normal to the surface of the cam for substantially all positions of the cam. The tendency of the cam to rotate due to the biasing force and thus disturb the fine tuning setting is thereby eliminated.

6 Claims, 6 Drawing Figures

TUNER DRIVE ASSEMBLY WITH NEUTRALIZED BIAS FOR ENHANCED STABILITY

The present invention relates to a tuner drive assembly for controlling the tuner mechanism in a TV receiver or the like and more particularly to a tuner drive assembly having excellent fine tuning sensitivity as well as enhanced fine tuning setting stability at any position of the fine tuning shaft and during coarse tuning shaft rotation.

Tuners designed when actuated to tune a receiving set such as a television receiver to a preselected one of a plurality of stations or channels are well known and take many forms. Insofar as the present invention is concerned, the precise nature of the means employed in the communications receiver itself to effect tuning to a particular reception frequency forms no part of the present invention. This invention is directed to the mechanism by which a tuning element, whatever its character, is adjusted for precise reception of a particular station or channel. The invention is here specifically disclosed in connection with a tuner designed to effect tuning over the entire UHF band, in which there are seventy or more individual channels. To provide a device capable of coarse tuning to any selected one of seventy or more available UHF channels, with sufficient accuracy so as to be capable of distinguishing in its tuning between any two adjacent channels, presents many problems, both mechanical and electrical. The public has become accustomed to step-by-step tuning in connection with the thirteen channels in the VHF band and therefore expects similar tuning capability in the UHF band. The much greater number of channels which must be tuned in the UHF band and the very high precision of tuning which is required because of the relatively close spacing of these channels, has given rise to special new mechanical arrangements for the UHF TV tuners.

It is important to the tuner manufacturer to produce tuners of extremely small size and at exceedingly low cost. Additionally, reliability and ease of manipulation of the tuning mechanism are features which must be present in the system. The incorporation of all these features into a single unit is often difficult to achieve.

Most TV tuner drive mechanisms utilize a coarse tuning shaft which is rotated to select the desired channel and a fine tuning shaft which is rotated to more accurately select the frequency of the channel and thus provide more precise tuning capability. Normally, each of these shafts is rotated by means of a separate, often coaxially aligned, knob. It is desirable that the knobs be so arranged and connected that the fine tuning shaft rotates along with the coarse tuning knob, thereby preserving the fine tuning setting throughout channel selection.

The interrelationship between the tuning shafts generally requires that the fine tuning shaft have a limited rotational range with respect to the coarse tuning shaft. Thus the fine tuning shaft must be capable of conditioning the tuner to provide fine tuning throughout a reasonable range of fine tuning capability by rotation throughout only a limited arc. However, the tuner rapidly becomes oversensitive to the rotation of the fine tuning shaft as the arc of rotation of the fine tuning shaft necessary to condition the tuner through a given frequency range approaches the arc of rotation of the coarse tuning shaft necessary to condition the tuner through the same range. In fact, it is desirable, within limits, to have a large rotation of the fine tuning shaft condition the tuner through only a small frequency range. Such an arrangement enhances tuner sensitivity.

In order to reconcile these mechanical difficulties a cam and cam follower configuration has been utilized to provide the interconnection between the tuning shafts. In this arrangement, the cam is operably connected to the fine tuning shaft and the cam follower is operably connected to the coarse tuning shaft. The rotation of the fine tuning shaft rotates the cam to pivot the cam follower. The rotation of the coarse tuning shaft rotates the cam follower. The rotation of the cam follower rotates the cam to preserve the fine tuning setting during channel selection. The pivoting and rotation of the cam follower both serve to rotate a pinion gear to rotate the tuner control shaft to condition the tuner.

A given angular rotation of the coarse tuning shaft rotates the pinion gear a certain amount to condition the tuner through a selected frequency range. It is desirable to have a system wherein a substantially greater angular rotation of the fine tuning shaft is necessary to rotate the pinion gear the same amount and thus condition the tuner through the same frequency range. In this way fine tuning oversensitivity is avoided. In order to accomplish this a mechanical reduction is achieved between the angular rotation of the fine tuning shaft and the amount of rotation of the pinion gear caused by the fine tuning shaft rotation. This result is accomplished by the slope of the cam surface. The steeper the slope of the cam surface the lower the mechanical reduction. For example, a reduction ratio of 2:1 requires a steeper slope than a reduction ratio of 5:1. A reduction ratio of 2:1 means that the fine tuning knob must be rotated through an angle of 60° to cause a 30° rotation of the pinion gear.

However, it is necessary to have a relatively low reduction ratio because of the limited range of fine tuning shaft rotation. For instance, if the permissible angular rotation of the fine tuning shaft is 108°, a reduction ratio of 2:1 would mean a fine tuning range of 54° in the pinion gear. This is acceptable. A reduction of 5:1 would mean a fine tuning range of only 21⅗° in the pinion gear. This is too limited a range for fine tuning. On the other hand, no reduction, i.e., a ratio of 1:1, creates oversensitivity. It is therefore necessary to have a steep slope on the cam surface.

Normally the cam and the cam follower are biased into contact by a tension spring one end of which is operably connected to the cam and the other end of which is operably connected to the cam follower. The spring creates a force at the point of contact of the cam and cam follower. This force can be resolved into a component normal to the cam surface and a component tangent to the cam surface at the point of contact. Obviously, as long as the tangential component of this force is zero, the spring will not cause rotation of the cam, regardless of its tension. The magnitude of the tangential force component is dependent upon the shape of the cam surface, i.e., the steepness of the slope of the surface.

Therefore, the greater the slope the greater the tangential force component. As soon as the tangential force component becomes greater than the friction on the cam, the cam will rotate thus disturbing the fine tuning setting. The effect of this is that with a steep slope, which cannot be avoided, the usual spring biasing arrangement causes the fine tuning setting to be unstable. This result is extremely undesirable.

It is, therefore, the prime object of the present invention to provide a tuner drive assembly wherein stability of the fine tuning setting is achieved regardless of the position of the fine tuning shaft.

A second object of the present invention is to provide a tuner drive assembly wherein the fine tuning setting is preserved during channel selection by interconnection of the fine and coarse tuning shafts.

It is a further object of the present invention to provide a TV tuner assembly wherein the limited range of angular rotation permitted to the fine tuning shaft can be utilized to condition the tuning mechanism to achieve fine tuning throughout an acceptable range.

Another object of the present invention is to provide a tuner mechanism construction in which the necessity for declutching the fine tuning shaft to preserve the fine tuning setting is eliminated.

A further object of the present invention is to provide a tuner drive mechanism construction in which all of the rotating parts of the assembly are sturdily and reliably mounted for long life and sure and easy rotation, in which the parts take up a minimal amount of space and are of minimal cost.

Still another object of the present invention is to devise a tuner assembly, the parts of which can be readily and inexpensively manufactured and assembled, and in which a replacement of defecitve parts if facilitated.

In accordance with the present invention, a tuner drive assembly for use with a tuning mechanism is provided with a coarse tuning shaft and a fine tuning shaft. The coarse tuning shaft and the fine tuning shaft are coaxially aligned with the fine tuning shaft, preferably being mounted within the coarse tuning shaft. Each of the shafts is provided with the appropriate control knob to facilitate manipulation of the shafts and thus the tuner. The fine tuning shaft is rotatable relative to the coarse tuning shaft through a limited angular range to permit fine tuning.

An actuating member is provided to condition the tuner mechanism to achieve tuning in accordance with the rotation of the coarse and fine tuning shafts. First and second means connecting each of the shafts respectively to the actuating member for operating the latter are also provided. The first means comprises a pair of relatively movable parts which normally rotate together in accordance with the rotation of the coarse tuning shaft. The second means comprises a cam, and, situated on one of the parts, a cam follower engaging the cam. The cam is drivingly connected to the fine tuning shaft and the movement of cam causes relative movement between the parts which operates the actuating member to condition the tuner to achieve fine tuning. Biasing means operably active on the cam follower maintains an operable connection between the cam and the cam follower. The biasing means are effective to exert a force substantially normal to the surface of the cam for substantially all positions of the cam thereby enhancing the stability of the fine tuning setting.

Through the use of the cam and cam follower arrangement, the necessity for the utilization of a declutching mechanism to disengage the fine tuning shaft from the remainder of the tuner drive assembly during channel selection is eliminated. The rotation of the coarse tuning shaft, due to the interconnection of the fine tuning shaft and the coarse tuning shaft through the cam and cam follower, will also cause simultaneous rotation of the fine tuning shaft and therefore preserve the fine tuning setting during channel selection. Further, because the biasing means maintains a connection force between the cam and the cam follower which is substantially normal to the surface of the cam throughout all positions of the cam, the cam follower will not exert a rotational torque on the cam. This eliminates the tendency of the fine tuning shaft to rotate due to internally created torque thus preserving the fine tuning setting. The present invention will therefore serve to preserve the integrity of the fine tuning setting regardless of the position of the fine tuning shaft as well as to promote the stability of the fine tuning setting as the coarse tuning shaft is rotated during channel selection.

To the accomplishment of the above, and to such other aspects as they hereinafter appear, the present invention relates to the structure of a tuner drive assembly as defined in the appended claims and as described in the specification, taken together with the accompanying drawings, wherein like numerals refer to like parts and in which:

The tuning element, generally designated A, which may be constituted by a rotary variable condenser-tuner transmission line or the like, is provided with a control shaft, generally designated B, mounted in a manner accessible to the exterior of the tuner. A rotatable coarse tuning shaft, generally designated C, is designed to effect tuning of the element A from one channel to the next. Normally, a coarse tuning knob (not shown) is provided on the extreme exterior end of the coarse tuning shaft C to facilitate rotation of the coarse tuning shaft C and therefore channel selection. Preferably mounted within the coarse tuning shaft C, and coaxially aligned therewith, is a rotatable fine tuning shaft D. A fine tuning shaft knob (not shown) is provided on the extreme exterior end of the fine tuning shaft D to facilitate rotation of the fine tuning shaft. The fine tuning shaft D is rotationally movable with respect to the coarse tuning shaft C throughout a limited range in order to permit manipulation of tuner A throughout the spectrum of fine tuning capability.

A first means, generally designated E, operably connects the coarse tuning shaft with a tuner actuating member, generally designated as F. A second means, generally designated as G, operably connects the fine tuning shaft with the first means E. Actuating member F is operably connected to control shaft B for transferring the rotation of coarse tuning shaft C and fine tuning shaft D to control shaft B in order to achieve channel selection and fine tuning, respectively. First means E comprises a pair of relatively movable parts which rotate together in accordance with the rotation of coarse tuning shaft C. The second means G comprises a cam which engages a cam follower surface situated on the interior of one of the parts. The cam is drivingly connected to the fine tuning shaft D. The movement of the cam causes relative pivotal movement between the parts due to the mechanical relationship between the cam surface and the surface of the cam follower. The parts are operably connected to actuating means F such that the rotational and pivotal movements of the cam follower bearing part is transferred to the actuating member F in order to manipulate tuner A to achieve channel selection and fine tuning, respectively. Biasing means, generally designated as H, is operatively active on the cam follower bearing part to maintain an operable connection between the cam and the cam follower surface. The biasing means is effective to exert a substantially normal biasing force on the surface of the cam for substantially all rotational positions of the cam.

Figure 1:
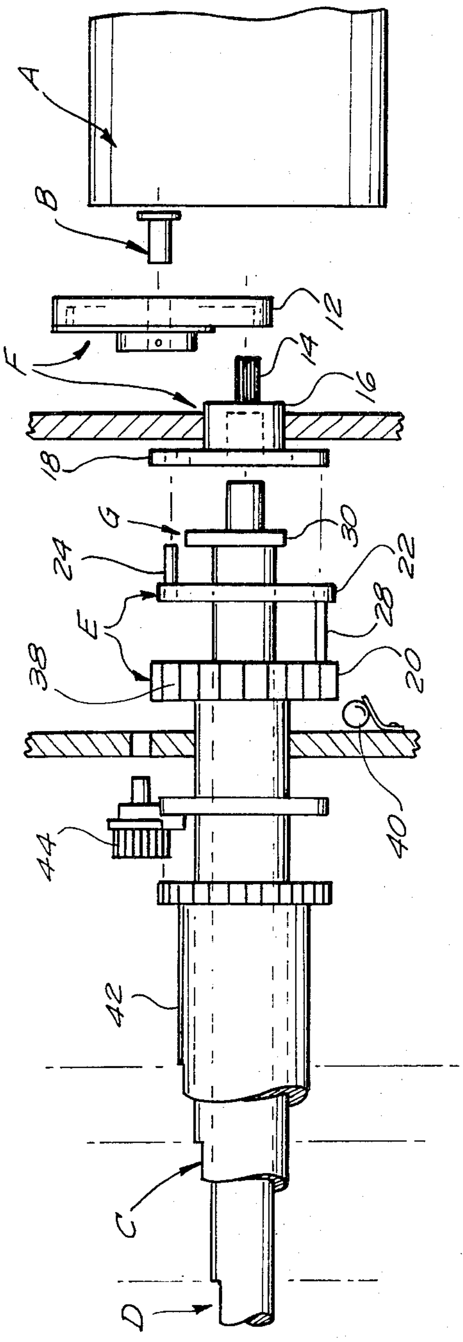
FIG. 1 is a side exploded view of a preferred embodiment of the present invention.
Figure 2:
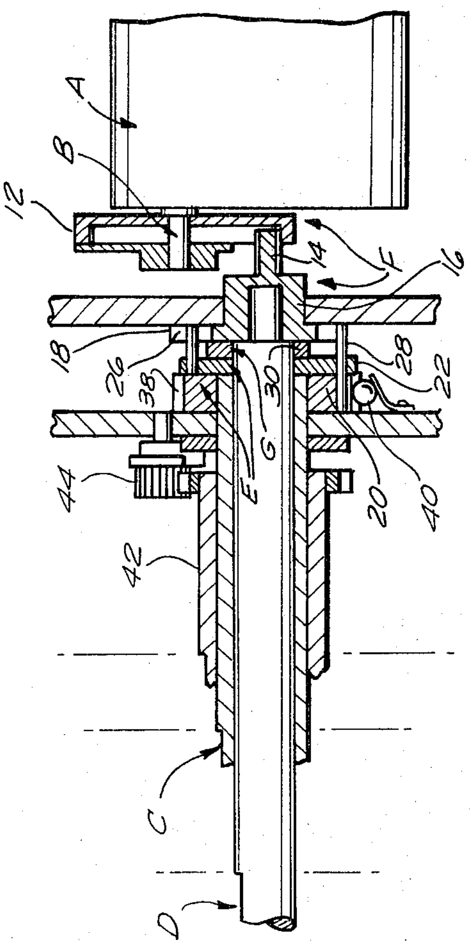
FIG. 2 is a side view of the embodiment of FIG. 1 showing the mechanism in assembled form.

More specifically, FIG. 1 shows an exploded view of a preferred embodiment of the present invention. Tuner mechanism A has a rotary tuner shaft B extending therefrom. The rotation of tuner shaft B will serve to corporeally condition tuner mechanism A in order to change the frequency to which the mechanism is tuned. Drivingly connected to tuner shaft B is actuating member F which will serve to rotate tuner shaft B in order to achieve the appropriate coarse and fine tuning in tuning mechanism A. Actuating member F consists of a drive gear 12 mounted on tuner shaft B which meshes with pinion gear 14 mounted on a rotatable member 16. The rotation of member 16 is transferred to drive gear 12 via pinion gear 14 in order to rotate tuner shaft B. Member 16 has a disc portion 18 operably connected to first means E to rotate in accordance with the movement of the first means E.

First means E comprises a pair of relatively movable parts, element 20 and ring 22, which normally rotate together. Element 20 is mounted on coarse tuning shaft C. Disc portion 18 and ring 22 are operably connected by means of pin 24, one end of which is mounted on ring 22. Disc portion 18 has a slot 26 into which the other end of pin 24 extends to form a moving connection between ring 22 and disc portion 18. Element 20 and ring 22 are operably connected by means of a pin 28 one end of which is mounted on element 20 and the other end of which is pivotally mounted on ring 22 such that element 20 and ring 22 rotate together to rotate disc portion 18 during channel selection and such that ring 22 may pivot about pin 28 relative to element 20 to cause rotation of disc portion 18 to achieve fine tuning.

The interior of ring 22 forms a cam follower surface 29. The cam follower surface 29 on the interior of ring 22 is situated to operably engage the surface of a cam 30 mounted on fine tuning shaft D. Element 20 is provided with an aperture such that fine tuning shaft D can extend through element 20 and the cam 30 can communicate with ring 22. The rotation of cam 30 acts on the cam follower surface to pivot ring 22 about pin 28. Because the pivoting of ring 22 is about pin 28, which is offset from the axis of rotation of disc portion 18, the moving connection achieved by slot 26 and pin 24 is necessary to allow for the differences in vertical displacement caused when ring 22 is pivoted to rotated disc portion 18. The pivotal movement of ring 22 rotates actuating member F to rotate tuner shaft B and thus condition tuner mechanism A to achieve fine tuning.

The connection between element 20 and ring 22 will cause ring 22 to rotate when element 20 is rotated by coarse tuning shaft C. Ring 22 will in turn rotate actuating member F to cause channel selection to be performed by tuning mechanism A.

Cam 30, mounted on the end of fine tuning shaft D, is rotated by the rotation of fine tuning shaft D. Cam 30 has a relatively steep slope in order to achieve the necessary small reduction ratio between the fine tuning shaft D and actuating member F. The rotation of cam 30 will cause ring 22 to pivot about pin 28 thus causing disc portion 18 to rotate an amount dependent on the slope of the cam. This pivotal movement is achieved by the appropriate curvature of the cam and cam follower surfaces. Normally, the fine tuning shaft D and thus cam 30, will be permitted only a limited range of rotation with respect to coarse tuning shaft C. In the preferred embodiment this permissible range is 108°. The cam and cam follower surfaces must, therefore, be formed such that a cam rotation of 108° will rotate actuating member F sufficiently to achieve fine tuning throughout the acceptable fine tuning range.

Further, it is necessary that operable contact be maintained between cam 30 and the cam follower surface at all times. This contact is achieved by a biasing means H shown in FIGS. 3, 4, and 5 as a tension spring 32. It is necessary that the force applied to bias the cam and cam follower into contact be substantially normal to the surface of cam 30 regardless of the relative position of the cam within its permissible rotational range of 108°. This will eliminate unwanted rotational changes in the position of the cam which would be caused by a rotational component of biasing force on cam 30.

Figures 3, 4, 5, 6:
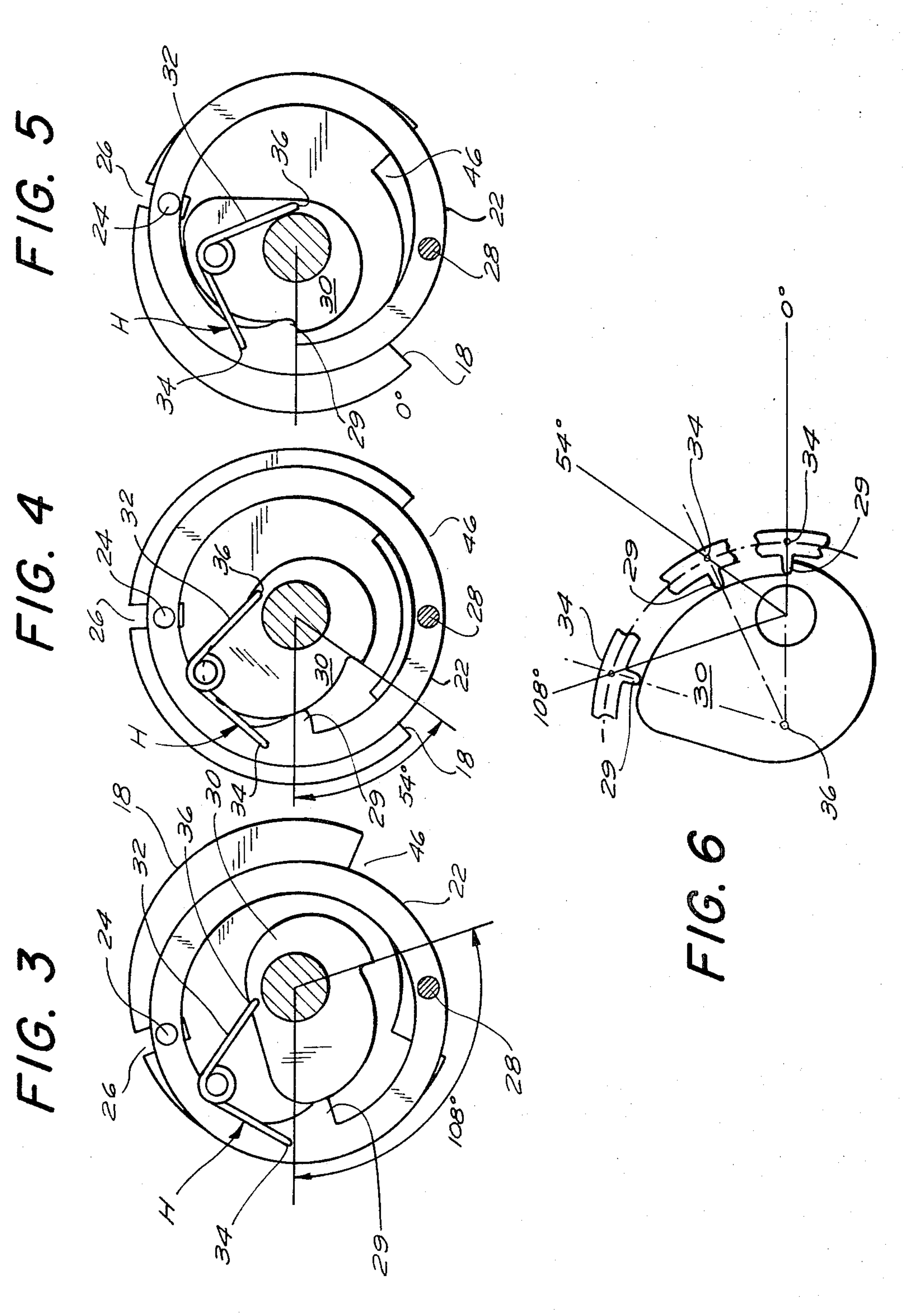
FIG. 3 is a front view of the cam and cam follower mechanism showing the cam rotated 108° with respect to the cam follower.
FIG. 4 is a view similar to FIG. 3 showing the cam rotated at 54° with respect to the cam follower.
FIG. 5 is a view similar to FIG. 3 showing the cam rotated at 0° with respect to the cam follower.
FIG. 6 is a view similar to FIG. 3 showing the placement of the point where the biasing means is connected to the cam to achieve uniform tension as the cam moves through its available rotational spectrum.

FIGS. 3, 4, and 5 show a front view of cam 30, ring 22 with its internal cam follower surface and immediately behind ring 22, disc portion 18 which forms a part of actuating member F. In addition, these drawings illustrate a tension spring 32 which is connected to ring 22 at point 34 and cam 30 at point 36. Cam 30 is rotatable through an arc of 108° with respect to ring 22. FIGS. 3, 4, and 5 illustrate some of the different rotational positions of cam 30, specifically at 108°, 54° and 0° degrees, respectively.

Disc portion 18 has a section 46 which is cut away to permit limited rotational movement of disc portion 18 with respect to ring 22 without interference from pin 28 which extends through ring 22. As cam 30 is rotated, ring 22 is pivoted about pin 28 in order to cause the rotation of disc portion 18. This pivotal movement of ring 22 is illustrated as cam 30 moves between an angle of 108° with respect to the cam follower (FIG. 3) through 54° (FIG. 4) to a rotation of zero degrees (FIG. 5). The cam 30, ring 22 and disc portion 18 combination is also rotatable in accordance with the rotation of element 20 because of the pin 28 which connects element 20 and ring 22. This rotation achieves channel selection. The interconnection between the tuning shafts C and D through the cam and cam follower arrangement causes the shafts to rotate together during channel selection, thus preserving the fine tuning setting.

A tension spring 32 is utilized to maintain the necessary communication between the surface of the cam 30 and the cam follower surface of the interior of ring 22. This tension spring is attached to ring 22 at point 34 and to cam 30 at point 36. In order to achieve fine tuning stability, and in accordance with the present invention, through the careful selection of these points, it has become possible to provide a biasing force substantially normal to the cam surface throughout substantially all rotational positions of the cam 30. Points 34 and 36 are selected such that the force created by urging the points towards one another acts along a line drawn perpendicular to the surface of the cam at the point of contact. This relationship must be present regardless of the position of cam 30 in order to provide a biasing force on cam 30 having only a normal component. No tangential component is present to cause a rotational torque on the cam. Such spring positioning tends to preserve the integrity of the fine tuning position regardless of the position of cam 30. Additionally, since no rotational torque is present, the cam tends to stay in the set fixed relative position with respect to ring 22 and the integrity of the fine tuning setting is preserved during channel selection regardless of the vibrations created by the rotation of the coarse tuning shaft.

FIG. 6 illustrates the method of determining the placement of points 34 and 36. FIG. 6 shows the relative position between points 34 and 36 at three locations along the rotational range of cam 32, specifically 0°, 54°, and 108°. This figure is schematic and illustrates the positioning of points 34 and 36 in a simplified case, i.e., wherein protrusion 29 is located immediately beneath point 34. In actuality, this may not be the case but the methods used are the same regardless of the position of protrusion 29. If one were to imagine a circle whose circumference passed through point 34 at each of these positions, and then determine the center of this circle, the center would then be point 36. Since the line drawn between points 34 and 36 passes through the point of contact in this simplified case, the only biasing force present is one which is normal to the surface of the cam at the point of contact.

As an additional feature of this placement, the tension on a spring placed in the manner described will remain constant. Since point 36 is equally distant from each of the positions of point 34 (because all radii of the circle are equal), the distance between these points will not change as the cam is rotated. Therefore, if the tension spring is connected between these points, the tension in this spring will not vary as the cam is rotated relative to ring 22. By the appropriate choice of points 34 and 36 rotational torque on the cam is eliminated, thus tending to facilitate the stabilization of the fine tuning setting throughout the entire available spectrum of fine tuning shaft rotation and spring tension is kept constant to further promote stability.

The reaction torque transmitted back to the cam from the tuner load torsion spring is very small due to the mechanical ratio within actuating member F. This force is typically less than 1 inch-oz. and is easily controlled by the friction produced by the spring 32 and other normal amounts of friction between the moving parts of the mechanism and their support bearings. Therefore, whatever tension is developed within the tuning mechanism itself will not affect the position of the fine tuning setting either. However, even if the back torque from the tuner torsion spring is appreciable, the net resulting rotational torque applied to the cam may be neutralized by the proper positioning of point 36 on the cam.

Again, referring to FIG. 1, the exterior of element 20 is preferably provided with a plurality of indentations 38 into which a spring-loaded detent ball 40 is urged. This conventional detent arrangement provides a simple indexing system to facilitate channel selection as well as assuring that the pivotal movement of ring 22 will not affect the position of coarse tuning shaft C and thus change the channel as fine tuning is performed.

Further, the preferred embodiment has a third coaxial shaft 42 which is indexed by a single step by indexing means 44 each time coarse tuning shaft is rotated through an angle corresponding to ten channels. Means may be provided (not shown) for indicating a units digit in accordance with the movement of coarse tuning shaft C and a tens digit in accordance with the movement of shaft 42. Thus, the channel to which the tuner mechanism is set can be made readily visible.

A simple preferred embodiment of the present invention has been specifically disclosed herein for purposes of illustration. It is apparent that many variations and modifications may be made upon the specific structure disclosed herein. It is intended to cover all of these variations and modifications which fall within the scope of this invention as defined by the appended claims.

I claim:

1. A tuner drive assembly having an actuating member, a coarse tuning shaft, a fine tuning shaft and first and second means connecting said shafts respectively to said actuating member for operating the latter, said first means comprising a pair of relatively movable parts which normally rotate together, said second means comprising a cam, and, situated on one of said parts, a cam follower engaging said cam, said cam being drivingly connected to said fine tuning shaft and movement of said cam causing relative movement between said parts, and biasing means operatively active on said cam follower to maintain an operable connection between said cam and said cam follower, said biasing means being effective to exert a resultant force substantially normal to the surface of said cam for substantially all positions of said cam.

2. A tuner drive assembly having an acutating member, a coarse tuning shaft, a fine tuning shaft and first and second means connecting said shafts respectively to said actuating member for operating the latter, said first means comprising a pair of relatively movable parts which normally rotate together, said second means comprising a cam, and, situated on one of said parts, a cam follower engaging said cam, said cam being drivingly connected to said fine tuning shaft and movement of said cam causing relative movement between said parts, and biasing means operatively active on said cam follower to maintain an operable connection between said cam and said cam follower, said biasing means being resilient and connected between points on said cam and said cam follower, said points being located such that as the movement of said cam causes relative movement between said parts, the force biasing these points towards each other acts substantially along a line normal to the surface of said cam at the point of contact between said cam and said cam follower.

3. The assembly according to claim 2 wherein said biasing means comprises a tension spring, said spring being connected to said cam follower at a first one of said points and connected to said cam at a second one of said points.

4. The assembly according to claim 3 wherein said second point is the center of the circle formed by the movement of the first point as said cam is moved with respect to said cam follower.

5. A tuner drive assembly having an actuating member, a coarse tuning shaft, a fine tuning shaft and first and second means connecting said shafts respectively to said actuating member for operating the latter, said first means comprising a pair of relatively movable parts which normally rotate together, said second means comprising a cam, and, situated on one of said parts, a cam follower engaging said cam, said cam being drivingly connected to said fine tuning shaft and movement of said cam causing relative movement between said parts, and biasing means operatively active on said cam follower to maintain an operable connection between said cam and said cam follower, said biasing means being resilient and connected between points on said cam and said cam follower, said points being located such that as the movement of said cam causes relative movement between said parts, the spacing between said points will remain substantially the same.

6. The tuner drive assembly according to claim 5 wherein said cam rotates about an axis and has a cam surface non-concentric to said axis, said point on said cam to which said biasing means is connected being substantially equidistant from points on said cam surface relatively close to and remote from said axis.

* * * * *